(12) United States Patent
Garvik

(10) Patent No.: US 11,990,910 B2
(45) Date of Patent: May 21, 2024

(54) CONTROL OF BIAS CURRENT TO A LOAD

(71) Applicant: Nordic Semiconductor ASA, Trondheim (NO)

(72) Inventor: Harald Garvik, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 17/729,844

(22) Filed: Apr. 26, 2022

(65) Prior Publication Data
US 2022/0345119 A1 Oct. 27, 2022

(30) Foreign Application Priority Data

Apr. 27, 2021 (GB) ..................................... 2106009

(51) Int. Cl.
*H03K 3/00* (2006.01)
*H03K 3/353* (2006.01)
*H03K 5/01* (2006.01)
*H03K 5/02* (2006.01)

(52) U.S. Cl.
CPC ............... *H03K 3/353* (2013.01); *H03K 5/01* (2013.01); *H03K 5/023* (2013.01)

(58) Field of Classification Search
CPC ................................. H03K 3/353; H03K 5/023
See application file for complete search history.

(56) References Cited

U.S. PATENT DOCUMENTS

| | | | | |
|---|---|---|---|---|
| 5,175,512 A * | 12/1992 | Self | ......................... | H03K 3/011 331/8 |
| 7,973,612 B2 * | 7/2011 | Raghunathan | ............ | H03L 7/22 331/34 |
| 9,455,675 B2 * | 9/2016 | Kong | ....................... | H03F 1/308 |
| 2012/0154048 A1 * | 6/2012 | Myles | ................. | H03F 3/45704 330/260 |

(Continued)

FOREIGN PATENT DOCUMENTS

| JP | 2004247805 | * | 9/2004 |
|---|---|---|---|
| JP | 2004247805 A | | 9/2004 |

OTHER PUBLICATIONS

IPO Combined Search and Examination Report under Sections 17 and 18(3) for GB2106009.0, dated Oct. 11, 2021, 8 pages.

(Continued)

*Primary Examiner* — Tuan T Lam
(74) *Attorney, Agent, or Firm* — Klarquist Sparkman, LLP

(57) ABSTRACT

A circuit portion comprises a load circuit portion and a bias circuit portion. The load circuit portion comprises a load transistor. The bias circuit portion comprises a replica transistor matched to the load transistor and connected to the load transistor at a node such that when a current flows through the replica transistor, a current proportional to the current through the replica transistor flows through the load transistor. The bias circuit portion also comprises a current input for receiving an input current, a supply voltage input for receiving a supply voltage, and a feedback loop arranged (Continued)

to: adjust a voltage at the node connecting the replica transistor and the load transistor such that the replica transistor conducts a current proportional to the input current, and counteract variations in the voltage at the node connecting the replica transistor and the load transistor arising from changes in the supply voltage.

14 Claims, 1 Drawing Sheet

(56) References Cited

U.S. PATENT DOCUMENTS

| | | | |
|---|---|---|---|
| 2012/0212200 A1* | 8/2012 | Amer | G05F 1/575 |
| | | | 323/282 |
| 2014/0268281 A1* | 9/2014 | Nelson | B60R 1/088 |
| | | | 359/267 |
| 2016/0118939 A1* | 4/2016 | Kong | H03F 1/308 |
| | | | 330/296 |
| 2019/0158031 A1 | 5/2019 | Klaren et al. | |
| 2020/0036341 A1* | 1/2020 | Klaren | H03F 1/0222 |

OTHER PUBLICATIONS

Vittoz, E.A., "Micropower Techniques," *Design of VLSI Circuits for Telecommunications and Signal Processing*, Ed. J.E. Franca and Y.P. Tsividis, Prentice Hall, Ch 5, Jan. 1994 (37 pages).

Hernes, et al., "A 92.5mW 205MS/s 10b Pipeline IF ADC Implemented in 1.2V/3.3V 0.13μm CMOS," *IEEE International Solid-State Circuits Conference*, 2007 (3 pages).

* cited by examiner

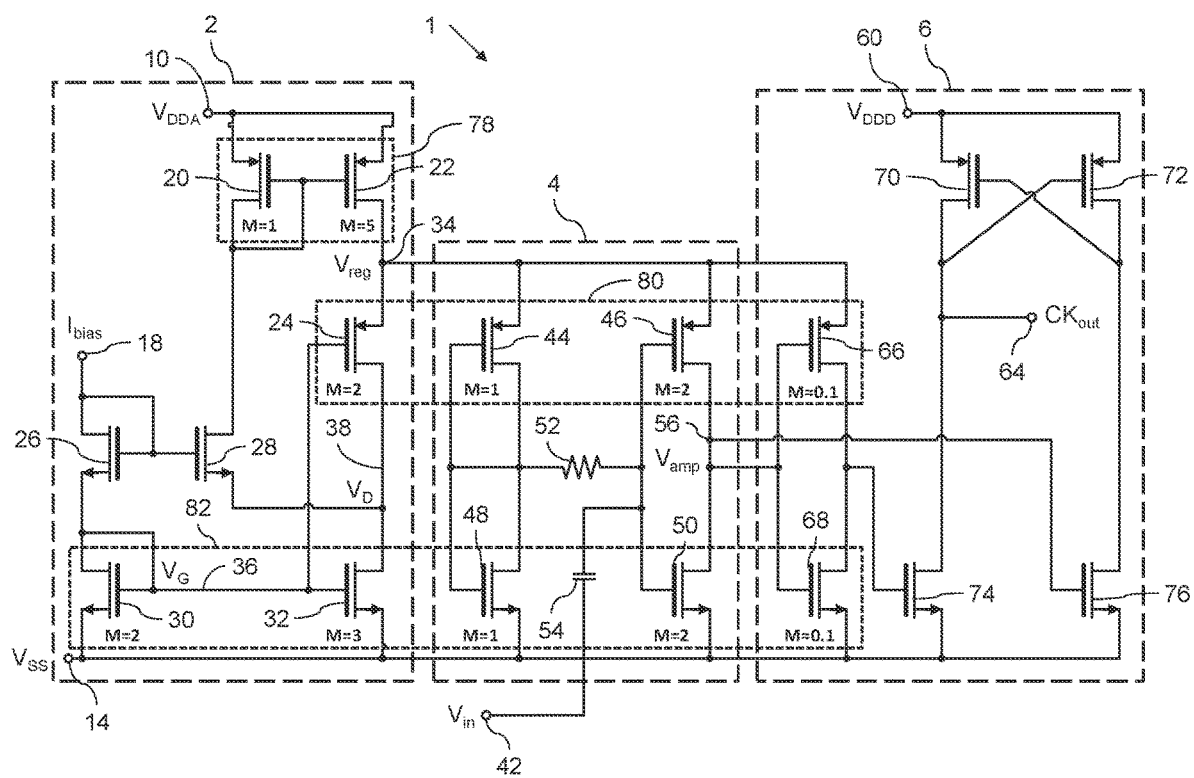

CONTROL OF BIAS CURRENT TO A LOAD

FIELD

The invention relates to a bias circuit for providing a bias current to a load circuit portion, particularly although not exclusively in relation to inverter amplifiers in sinusoid-to-square wave buffers.

BACKGROUND

In many applications, various components and/or circuit portions (typically active components) require a bias current or voltage to be provided thereto in order to power such components. In some applications it is important that a particular component or circuit portion is provided with a substantially constant bias current or voltage, with minimum noise, if the component is to be able to operate with low noise (e.g. provide a low-noise output signal). Furthermore, it is important in some applications to maintain performance of a particular component or circuit portion over across process, voltage and temperature (PVT) variations.

Inverter amplifiers in particular typically require a low-noise bias current or voltage to be provided thereto as they have a poor power supply rejection ratio (PSRR), meaning that the noise level in a signal output by an inverter amplifier is highly dependent on the noise level in the supply/bias voltage provided thereto. It is therefore important that inverter amplifiers are connected to a clean power supply in order for the inverter amplifier to be able to output a low-noise signal. Inverter amplifiers also typically require the bias current provided thereto to be controlled in order to provide consistent performance across PVT variations. Generating a controlled bias current can be relatively straightforward if a large enough current is drawn from a power supply, e.g. through the use of a configurable current divider. However, drawing a large current in this manner is very energy inefficient, and it is desirable to be able to provide a controlled bias current while using a minimum of extra current.

Sinusoid-to-square wave buffers/converters are typically used to generate clock signals which may be used to coordinate the actions of electronic circuits, particularly for timing purposes. Clock signals typically comprise a periodic, single-phase square-wave signal which allows clocked components to coordinate their timing by detecting edges (rising or falling dependent on the application) of the clock signal. Generating periodic, sinusoidal signals in practice is reasonably straightforward, as many different types of oscillators are known, including quartz crystal oscillators, resistor-capacitor (RC) oscillators, inductor-capacitor (LC) oscillators, etc. In order for these sinusoidal signals to be effectively used as clock signals, they must first be converted into square-wave signals.

Inverter amplifiers can be used to generate square wave clock signals from sinusoidal input signals. They are particularly attractive for sinusoid-to-square wave buffers as they are typically low-noise. As a result, clock signals output by inverter-based sinusoid-to-square wave buffers can be low jitter, provided a clean voltage supply and controlled bias current are provided thereto.

The present invention aims to address some of the issues set out above.

SUMMARY

When viewed from a first aspect, the invention provides a circuit portion comprising:

a load circuit portion comprising a load transistor; and
a bias circuit portion comprising:
  a replica transistor matched to the load transistor and connected to the load transistor at a node such that when a current flows through the replica transistor, a current proportional to the current through the replica transistor flows through the load transistor;
  a current input for receiving an input current;
  a supply voltage input for receiving a supply voltage; and
  a feedback loop arranged to:
    adjust a voltage at the node connecting the replica transistor and the load transistor such that the replica transistor conducts a current proportional to the input current; and
    counteract variations in the voltage at the node connecting the replica transistor and the load transistor arising from changes in the supply voltage.

Thus it will be seen that, in accordance with the invention, the bias circuit portion effectively provides a bias voltage to the load circuit portion at the node connecting the replica transistor and the load transistor. The bias voltage is regulated by the feedback loop of the bias circuit portion such that the load transistor conducts a current that is proportional to the input current, and therefore the bias circuit portion also effectively provides a controlled bias current to the load circuit portion. The bias circuit portion therefore effectively isolates the bias voltage supplied to the load circuit portion from the supply voltage, thus minimising noise and/or jitter in an output of the load circuit portion.

The term 'matched' as used herein means that two or more transistors are of the same type (e.g. PMOS or NMOS) and selected to have similar characteristics (e.g. offset voltage, temperature drift, current gain, etc.) such that the current flowing through them for a given set of condition (voltage, temperature etc.) is either substantially the same or the same to within ratio determined by their relative sizes (also referred to herein as the a multiplication or M-factor ratio). In a set of embodiments the replica transistor and the load transistor have an M-factor ratio of 1.

Furthermore, the bias circuit portion effectively provides a bias current to the load circuit portion that may have a predictable relationship—e.g. being proportional to the input current over even large PVT variations, as any PVT variations in the load transistor are replicated in the matched replica transistor, the current through which is controlled by the input current. The input current may be controlled such that it exhibits predictable or small PVT variations, and thus by ensuring that the bias current provided to the load circuit portion has a predictable—e.g. proportional—relationship to the input current, any PVT variations in the bias current may track the small or predictable PVT variations in the input current. This means that any PVT variations in the load circuit portion may have a minimal effect on the bias current provided thereto by the bias circuit portion. Additionally, only a small input current is required by the bias circuit portion. This has the advantage that circuit portions in accordance with the invention can be more power efficient. In some embodiments, the input current is less than or equal to 50 nA, more preferably less than or equal to 10 nA, more preferably less than or equal to 5 nA, more preferably less or equal to 3 nA.

In a set of embodiments, the load transistor forms part of a load inverter, which may also be referred to herein as a load inverting amplifier. The load inverter may comprise a plurality of transistors including the load transistor.

Similarly, in a set of embodiments, the replica transistor forms part of a replica inverter, which may also be referred to herein as a replica inverting amplifier. The replica inverter may comprise a plurality of transistors including the replica transistor. The replica inverter may be arranged to replicate the load inverter. The or each transistor of the replica inverter may be matched to the or each transistor of the load inverter.

In a set of embodiments, the load circuit portion comprises a second load transistor, and the bias circuit portion comprises a second replica transistor matched to the second load transistor. The first and second replica transistors may be arranged in a manner that replicates the arrangement of the first and second load transistors.

The first and second replica transistors may be arranged to replicate a current branch of the load circuit portion comprising the first and second load transistors.

By including the first and second replica transistors in the bias circuit portion and arranging them to replicate the arrangement of the first and second load transistors, potentially replicating an entire current branch of the load circuit portion, the bias circuit portion is able to control the voltage at the node connecting the first replica transistor and the first load transistor, using the feedback loop, such that the replica current branch conducts a current proportional to the input current. As the replica transistors and load transistors are matched, the bias circuit portion is therefore also able to control the bias current provided to the replicated current branch of the load circuit portion.

In a set of embodiments, the bias circuit portion comprises a plurality of further transistors, wherein at least one of the further transistors is matched to at least one other further transistor. The matched further transistors of the bias circuit portion may have an M-factor ratio selected to adapt the bias circuit portion to a DC load current of the load circuit portion. The load circuit portion may comprise further current branches that are not replicated in the bias circuit portion, thus increasing the total DC load current of the load circuit portion. The M-factor ratio of the matched further transistors of the bias circuit portion may be selected to ensure the total current supplied to the node connecting the first replica transistor and the first load transistor is sufficient for supplying the total DC load current required by the load circuit portion.

The bias circuit portion may have a non-negligible output impedance at the node connecting the first replica transistor and the first load transistor. As a result, the DC load current of the load circuit portion may affect the voltage at the node connecting the first replica transistor and the first load transistor. This may alter a bias point of the bias circuit portion, thus decreasing the effectiveness of the bias circuit portion. Hence, the M-factor ratios of the matched further transistors of the bias circuit portion may be selected with a specific load in mind, particularly a specific DC load current of the load circuit portion. The input current provided to the bias circuit portion may also be adapted to the DC load current required by the load circuit portion.

As a result of this non-negligible output impedance at the node connecting the first replica transistor and the first load transistor, the bias circuit portion may primarily provide line regulation with limited load regulation—i.e. the bias circuit portion may be able to easily maintain a specific voltage at the node connecting the first replica transistor and the first load transistor given changes in the supply voltage, but not quite so easily maintain the voltage at said node given changes in the load circuit portion.

In a set of embodiments, the feedback loop comprises a plurality of feedback transistors, wherein at least one feedback transistor is matched to at least one other feedback transistor. The matched feedback transistors may have an M-factor ratio selected to adapt the bias circuit portion to a specific DC load current of the load circuit portion. One of the matched feedback transistors may be diode-connected, and a gate terminal of one of the matched pair of feedback transistors may be connected to a gate terminal of the other of the matched pair of feedback transistors. One of the feedback transistors may be arranged to supply the total current required by the first replica transistor and the load circuit portion.

In some embodiments, the bias circuit portion comprises two current branches in addition to a single current branch for the input current. This has the distinct advantage of allowing the bias circuit portion, and therefore the circuit portion provided according to the present invention, to be physically compact. This enables the circuit portion to be easily implemented into e.g. a printed circuit board (PCB), an integrated circuit, a system-on-chip (SoC), etc. whilst requiring a minimum of space.

In embodiments in which the load circuit portion comprises a load inverter amplifier, the first and second load transistors may comprise a current branch within said load inverter amplifier. Inverter amplifiers typically require a clean voltage supply due to their low power supply rejection ratio, and require a controlled bias current in order to achieve consistent performance across PVT variations. The Applicant has recognised that the circuit portion in accordance with the present invention is particularly useful in applications where the load circuit portion is an inverter amplifier, as the bias circuit portion can effectively provide a clean voltage supply and a controlled bias current to the inverter amplifier thereby minimising the noise and/or jitter levels in an output of the inverter amplifier. In a set of embodiments, the inverter amplifier is run in open loop, thereby maximising the gain provided by the inverter amplifier.

In a set of embodiments, the invention extends to a sinusoid-to-square wave buffer or converter circuit portion as set out herein and further comprising a signal input for receiving a sinusoidal input signal and a signal output for outputting a resulting square wave clock signal. In such embodiments, the load circuit portion may comprise an inverter amplifier. The inverter amplifier may be arranged to receive the sinusoidal input signal and output a square-wave signal of the same frequency. The use of the term "same" here is used to mean that the square-wave signal output by the inverter amplifier may have a frequency within 5%, preferably 1%, more preferably 0.1%, more preferably 0.01% of the frequency of the sinusoidal input signal. The Applicant has recognised that inverter amplifiers are particularly attractive for sinusoid-to-square wave buffers in light of the characteristics mentioned above—i.e. that they are typically low-noise and able to output a low-jitter clock signal as a result, assuming a suitable bias.

The sinusoid-to-square wave buffer described above may have numerous advantages over other solutions. Firstly, minimal resistor-capacitor filtering (RC-filtering) is required. This has the advantage of reducing the area footprint of the sinusoid-to-square wave buffer, as high-quality resistors and capacitors are typically physically large. Furthermore, such sinusoid-to-square wave buffers may not be susceptible to bandwidth issues which may be introduced through the use of RC-filtering. Secondly, no switched capacitor means are required. Switched capacitor solutions require an external clock signal to function, meaning a device comprising a switched capacitor-based sinusoid-to-square wave buffer would require further components arranged to output a clock signal in order to enable the switched capacitor solution to function, thereby increasing cost, footprint and power consumption.

In a set of embodiments, the inverter amplifier is run in open loop, thereby maximising the gain provided by the inverter amplifier. As a result, the inverter amplifier may be arranged to convert the sinusoidal input signal to a square-wave output signal with maximum gain.

In a set of embodiments, the sinusoid-to-square wave buffer or converter described above further comprises a level shifter arranged to shift the voltage levels of the square-wave clock signal output by the inverter amplifier to a predetermined system voltage. Further components of a device comprising the sinusoid-to-square wave buffer that use the clock signal output by the buffer may only be able to accept a clock signal with a specific voltage (i.e. within specified high and low voltage levels). As the effective supply/bias voltage provided to the inverter amplifier is the voltage at the node connecting the first replica transistor and the first load transistor, which is in turn controlled by the feedback loop of the bias circuit portion, a square-wave clock signal output by the inverter amplifier may not have a voltage that can be accepted by other components. Thus, the inclusion of a level shifter enables the sinusoid-to-square wave buffer to output a clock signal of a known system voltage which can be used by other components.

In a set of embodiments, the invention extends to an electronic device comprising a sinusoid-to-square wave buffer as set out above, an oscillator arranged to output a sinusoidal signal and a current source arranged to output the input current, wherein the sinusoid-to-square wave buffer is arranged to receive the sinusoidal signal and output a square wave clock signal of the same frequency. The oscillator may comprise a quartz crystal oscillator, a resistor-capacitor (RC) oscillator, an inductor-capacitor (LC) oscillator, etc. The oscillator may be connected to an input of the inverter amplifier, and an output of the inverter amplifier may be connected to an input of the level shifter, if provided.

The terms "circuit", "circuitry" and "circuit portion" as used herein may refer to open circuits or to closed circuits; i.e. they encompass circuit portions that may form part of a closed circuit when connected to other elements such as a power supply.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

Certain preferred embodiments of the invention will now be described, by way of example only, with reference to the accompanying drawings, in which:

FIG. 1 is a circuit diagram of a sinusoid-to-square wave buffer comprising a bias circuit portion according to an embodiment of the invention.

DETAILED DESCRIPTION

FIG. 1 shows a sinusoid-to-square wave buffer 1 comprising a bias or voltage regulator circuit portion 2, a load circuit portion provided by an inverter amplifier portion 4, and a level shifter portion 6. As explained in greater detail below, the bias circuit portion 2 provides a bias current to the inverter amplifier portion 4 that is maintained proportional to an input current $I_{bias}$ across process-voltage-temperature (PVT) variations, and provides a clean voltage supply (i.e. with minimum noise and/or jitter) to the inverter amplifier portion 4. The inverter amplifier portion 4 converts an incoming sinusoidal signal to a square wave signal using the incoming bias current and voltage supply from the bias circuit portion 2. The level shifter portion 6 converts the square wave signal from an internal voltage of the inverter amplifier portion 4 to a defined system voltage for a particular power domain.

The bias circuit portion 2 is coupled to the inverter amplifier portion 4, which is in turn coupled to the level shifter portion 6. The bias circuit portion 2 may also be referred to herein as a voltage regulator circuit portion 2.

The bias circuit portion 2 is coupled to a positive voltage supply rail $V_{DDA}$ 10, a negative voltage supply or ground rail $V_{SS}$ 14, and a current source (not shown) which produces an input current $I_{bias}$ provided to a current input 18. In this example, the positive voltage supply rail $V_{DDA}$ 10 provides a supply voltage to the bias circuit portion 2 and the inverter amplifier portion 4. The input current $I_{bias}$ typically exhibits predictable or small PVT variations. For example, the input current $I_{bias}$ may be proportional to absolute temperature (PTAT) in order to compensate for a decrease in transconductance (e.g. due to a temperature increase) in the transistors included in the sinusoid-to-square wave buffer 1. In other examples, the input current $I_{bias}$ may be substantially PVT-stable, though this is not essential. The input current $I_{bias}$ is nominally equal to 3 nA in one example but is not limited as such—the input current $I_{bias}$ may have any appropriate value. The bias circuit portion 2 comprises three p-type metal-oxide-semiconductor (PMOS) field-effect transistors (FET) 20, 22 & 24, and four n-type metal-oxide-semiconductor (NMOS) field-effect transistors (FET) 26, 28, 30 & 32. The transistors described herein are not limited to PMOS and NMOS transistors as shown in this example, but may comprise any appropriate type of transistor.

The source terminals of two of the PMOS transistors 20 & 22 are coupled to the positive voltage supply rail $V_{DDA}$ 8 via the supply voltage input 10. The gate terminal of one of the PMOS transistors 20 is coupled to the gate terminal of the other PMOS transistor 22. The first PMOS transistor 20 is diode-connected and therefore the gate terminal thereof is coupled to the drain terminal thereof. The drain terminal of the first PMOS transistor 20 is coupled to the drain terminal of one of the NMOS transistors 28, and the drain terminal of the second PMOS transistor 22 is coupled to the source terminal of a third PMOS transistor 24 at a first node 34.

The drain terminal of another of the NMOS transistors 26 is coupled to the current source 16 producing the input current $I_{bias}$ via the current input 18. This second NMOS transistor 26 is diode-connected and therefore the gate terminal thereof is coupled to the drain terminal thereof. The gate terminal of the NMOS transistor 26 is coupled to the gate terminal of the first NMOS transistor 28. The source terminal of the second NMOS transistor 26 is coupled to the drain terminal of a third NMOS transistor 30. The third NMOS transistor 30 is diode-connected and therefore the gate terminal thereof is coupled to the drain terminal thereof. The source terminal of the third NMOS transistor 30 is coupled to the ground rail $V_{SS}$ 14. The gate terminal of the third NMOS transistor 30 is coupled to the gate terminal of a fourth NMOS transistor 32 and to the gate terminal of the third PMOS transistor 24 at a second node 36.

The drain terminal of the third PMOS transistor 24 is coupled to the drain terminal of the fourth NMOS transistor 32 and to the source terminal of the first NMOS transistor 28 at a third node 38. The source terminal of the fourth NMOS transistor 32 is coupled to the ground rail $V_{SS}$ 14.

The inverter amplifier portion 4 is coupled to the first node 34, to the ground rail $V_{SS}$ 14, and to a sinusoidal input signal $V_{in}$ 42. The sinusoidal input signal $V_{in}$ 42 may be generated by any appropriate source (not shown), e.g. a crystal oscillator, a resistor-capacitor (RC) oscillator, an inductor-capacitor (LC) oscillator, etc. The inverter amplifier portion comprises two PMOS transistors 44 & 46, two NMOS transistors 48 & 50, a resistor 52 and a capacitor 54.

The source terminal of one of the PMOS transistors 44 is coupled to the first node 34. The gate terminal of the PMOS transistor 44 is diode-connected and therefore the gate terminal thereof is coupled to the drain terminal thereof. One of the NMOS transistors 48 is diode-connected and therefore the gate terminal thereof is coupled to the drain terminal thereof. The gate and drain terminals of the first PMOS transistor 44 are coupled to the gate and drain terminals of the first NMOS transistor 48. The source terminal of the first NMOS transistor 48 is coupled to the ground rail $V_{SS}$ 14.

The source terminal of the second PMOS transistor 46 is also coupled to the node 34. The gate terminal of the second PMOS transistor 46 is coupled to the gate terminal of the second NMOS transistor 50. The drain terminal of the second PMOS transistor 46 is coupled to the drain terminal of the second NMOS transistor 50 at a fourth node 56. The source terminal of the second NMOS transistor 50 is coupled to the ground rail $V_{SS}$ 14. The gate terminals of the second PMOS transistor 46 and the second NMOS transistor 50 are coupled, via the resistor 52, to the gate and drain terminals of the first PMOS transistor 44 and the first NMOS transistor 48. The gate terminals of the second PMOS transistor 46 and the second NMOS transistor 50 are also coupled, via the capacitor 54, to the sinusoidal input signal $V_{in}$ 42.

The level shifter portion 6 is coupled to a second positive voltage supply rail $V_{DDD}$ 60, to the ground rail $V_{SS}$ 14, and to the fourth node 56. The level shifter portion 6 outputs a square wave clock signal $CK_{out}$ 64, which may be coupled to further components (not shown) requiring a square wave clock signal e.g. for timing purposes. The level shifter portion 6 comprises three PMOS transistors 66, 70 & 72, and three NMOS transistors 68, 74 & 76.

The source terminal of the first PMOS transistor 66 is coupled to the first node 34. The gate terminal of the first PMOS transistor 66 is coupled to the gate terminal of the first NMOS transistor 68 and to the fourth node 56. The drain terminal of the PMOS transistor 66 is coupled to the drain terminal of the first NMOS transistor 68. The source terminal of the first NMOS transistor 68 is coupled to the ground rail $V_{SS}$ 14.

The source terminals of the second and third PMOS transistors 70 & 72 are coupled to the positive voltage supply rail $V_{DDD}$ 60. The PMOS transistors second and third 70 & 72 are cross-coupled, therefore the gate terminal of the second PMOS transistor 70 is coupled to the drain terminal of the third PMOS transistor 72, and the gate terminal of the third PMOS transistor 72 is coupled to the drain terminal of the second PMOS transistor 70. The drain terminal of the second PMOS transistor 70 is coupled to the drain terminal of the second NMOS transistor 74, and to the clock signal output 64. The gate terminal of the second NMOS transistor 74 is coupled to the drain terminals of the first PMOS transistor 66 and the first NMOS transistor 68. The source terminal of the second NMOS transistor 74 is coupled to the ground rail $V_{SS}$ 14. The drain terminal of the third PMOS transistor 72 is coupled to the drain terminal of the third NMOS transistor 76. The gate terminal of the third NMOS transistor 76 is coupled to the fourth node 56. The source terminal of the third NMOS transistor 76 is coupled to the ground rail $V_{SS}$ 14.

The first and second PMOS transistors 20 & 22 of the bias circuit portion 2 are matched, with a multiplication factor (M-factor) ratio of 1:5 respectively as shown below each transistor, together forming a first matched transistor group 78. The third PMOS transistor 24 of the bias circuit portion 2, the first and second PMOS transistors of the inverter amplifier portion 44, 46 and the first PMOST transistor 66 of the level shifter 6 are also matched, with an M-factor ratio of 2:1:2:≈0.1 respectively as shown below each transistor, together forming a second matched transistor group 80. The corresponding NMOS transistors 30, 32, 48, 50 & 68 are also matched, with an M-factor ratio of 2:3:1:2:≈0.1 respectively, together forming a third matched transistor group 82.

In this example the second PMOS transistor 46 of the inverter amplifier 4 acts as a first load transistor and the second NMOS transistor 50 of the inverter amplifier 4 acts as a second load transistor. The second PMOS transistor 24 of the bias circuit portion 2 acts as a first replica transistor, the third NMOS transistor 30 of the bias circuit portion 2 acts as a second replica transistor and the first node 34 is therefore a node connecting the first replica transistor and the first load transistor. The second PMOS transistor 46 and the second NMOS transistor 50 of the inverter amplifier 4 together act as a current branch of the load circuit portion that is replicated in the bias circuit portion 2 (i.e. a replicated current branch of the load circuit portion).

Operation of the sinusoid-to-square wave buffer 1 will now be described in more detail. The bias circuit portion 2 biases the second PMOS transistor 46 and the second NMOS transistor 50 of the inverter amplifier with a bias current equal to $I_{bias}$ by adjusting the voltage $V_{reg}$ at the first node 34. The voltage $V_{reg}$ at the first node 34, provided by the bias circuit portion 2, provides a clean voltage supply to the inverter amplifier portion 4 thereby isolating it from the potentially noisy positive voltage supply rail $V_{DDA}$ 10. Inverter amplifiers typically suffer from a poor power supply rejection ratio (PSRR). This means that the noise level in the output voltage of an inverter amplifier is highly dependent on the noise level in the supply voltage provided thereto. It is therefore important to provide a clean voltage supply to the inverter amplifier portion 4 in order for it to output a low-noise voltage signal. It is also important to provide a controlled bias current to the inverter amplifier portion 4 in order to achieve consistent performance across PVT variations.

The way in which the bias circuit portion 2 provides a low-noise voltage supply $V_{reg}$ at the first node 34 and a controlled bias current equal to $I_{bias}$ to the transistors 46 & 50 of the inverter amplifier portion 4 will now be described in detail. The third PMOS and NMOS transistors 24 & 30 of the bias circuit portion 2 replicate the second PMOS and NMOS transistors 46 & 50 of the inverter amplifier portion 4, and the transistors first and second PMOS transistors 20, 22 and the second NMOS transistor 28 of the bias circuit portion 2 act as a feedback loop to control the voltage $V_{reg}$ at the first node 34 such that the second PMOS transistor 24 of the bias circuit 2 conducts a current equal to $I_{bias}$. This feedback loop also functions as a voltage regulator by counteracting variations in the voltage $V_{reg}$ at the first node 34 generated as a result of variations in the positive voltage supply rail $V_{DDA}$ 10.

The current $I_{bias}$ flows through the diode-connected second and third NMOS transistors 26 and 30 of the bias circuit 2. The 2:3 M-factor ratio between the third and fourth NMOS transistors 30 and 32 respectively of the bias circuit 2 thereby causes a current equal to $1.5 \times I_{bias}$ to flow through the transistor 32, drawn from the second node 38 at which the voltage is equal to $V_D$.

The third PMOS transistor 24 of the bias circuit 2 and the second PMOS transistor 46 of the inverter amplifier 4 are matched as previously described and have an M-factor ratio of 2:2, and therefore have equal gate-source voltages ($V_{gs}$). The reasons for this equal gate-source voltage ($V_{gs}$) will be described in further detail below with reference to the operation of the inverter amplifier portion 4.

It can therefore be seen that the current through the second PMOS transistor 46 of the inverter amplifier is equal to is equal to the current through the third PMOS transistor 24 of the bias circuit 2, which current may be called $I_x$. However due to the 2:1 M-factor ratio between the third PMOS transistor 24 of the bias circuit and the first PMOS transistor 44 of the inverter amplifier, the current through the latter transistor 44 is equal to $(\frac{1}{2})I_x = 0.5I_x$. The current through the first PMOS transistor 66 of the level shifter 6 is negligible, as the M-factor ratio between the third PMOS transistor 24 of the bias circuit and that transistor 66 is 2:≈0.1. As the second PMOS transistor 22 of the bias circuit supplies current to each of the transistors 24, 44, 46 & 66, the current through the second PMOS transistor 22 of the bias circuit is equal to $(1+0.5+1)I_x \approx 2.5I_x$, ignoring the negligible current through the level shifter transistor 66.

As the first and second PMOS transistors 20 and 22 of the bias circuit have a 1:5 M-factor ratio, the current through the first PMOS transistor 20 is equal to $(2.5/5)I_x = 0.5I_x$. The current through the first NMOS transistor 28 is therefore also equal to $0.5I_x$. The total current entering the third node 38 (at which the voltage is equal to $V_D$) is equal to the sum of the currents through the second PMOS transistor 24 and the first NMOS transistor 28, and the total current leaving the third node 38 is equal to the current through the transistor 32. The total current entering the node 38 is therefore equal to $(1+0.5)I_x = 1.5I_x$, and the total current leaving the third node 38 is equal to $1.5I_{bias}$. As the total current entering a node must equal the total current leaving the node, this gives the result that $1.5I_x = 1.5I_{bias}$, and therefore $I_x = I_{bias}$. Therefore the current through the third PMOS transistor 24 of the bias circuit, and consequently the bias current provided to the second PMOS transistor 46 of the inverter amplifier portion 4, is equal to $I_{bias}$.

The M-factor ratio between the first and second NMOS transistors 28, 26 of the bias circuit does not directly influence the bias current provided by the bias circuit portion 2 to the inverter amplifier portion 4, but sets the voltage $V_D$ at the third node 38. However, in this example the M-factor ratio between these transistors 26 and 28 is set to be 2:1. This causes the voltage $V_D$ at the third node 38 to be equal to the voltage $V_G$ at the second node 36, which in turn is equal to the mid-point output voltage of the inverter amplifier portion 4.

The output impedance of the bias circuit portion 2 at the first node 34 (at which the voltage is equal to $V_{reg}$) is not negligible as it would be in an ideal voltage regulator, but is instead approximately equal to $1/(g_{m24}(1+K))$, where K is equal to the M-factor ratio between the first and second PMOS transistors 20 and 22 of the bias circuit and $g_{m24}$ is equal to the conductance of the third PMOS transistor 24. As a result of this, in order for the bias circuit portion 2 to be most useful, the load current must be known and controlled. This is the case in the sinusoid-to-square wave buffer 1 implementation shown in FIG. 1, as the M-factors of the transistors 20, 22, 24, 26, 28, 30 & 32 of the bias circuit portion 2 have been adapted specifically to the load current through the transistors 44 and 46 of the inverter amplifier portion 4. The bias circuit portion 2 therefore primarily provides line regulation with limited load regulation, as well as providing a bias current to the inverter amplifier portion 4.

In order properly to adapt the bias circuit portion 2 to a different inverter amplifier load, the DC load current must be known and its variation must remain within a certain range depending on the design sizing. Any extra/less load current provided in the inverter amplifier portion 4 would cause current to be taken from/given to the third PMOS transistor 24 respectively, and thus changes to the load current would alter the bias point of the bias circuit 2. Additionally, the non-negligible output impedance of $1/(g_{m24}(1+K))$ leads to changes in the load current altering the voltage $V_{reg}$ at the first node 34. However, the bias circuit portion 2 can be adapted to a new load (with a known DC load current) by changing the input current $I_{bias}$ provided by the current source 16, or by changing the M-factor ratio between the transistors 20 and 22.

Inverter amplifiers are particularly susceptible to changes in bias voltage when compared to other applications for which the bias circuit portion 2 may be suitable, e.g. non-inverting amplifiers, buffer amplifiers, etc. In order to adapt the bias circuit portion 2 to a different application (i.e. other than an inverter amplifier), the input current $I_{bias}$ provided at the current source input 16 and the M-factor ratio between the first and second PMOS transistors 20 and 22 of the bias circuit simply need to be selected such that the voltage $V_{reg}$ generated at the first node 34 is suitable for the selected application, and that the bias circuit portion 2 provides a suitable current for the selected application's load current range.

Operation of the inverter amplifier portion 4 will now be described in more detail. The inverter amplifier portion 4 receives a sinusoidal input signal $V_{in}$ 42, at the gate terminals of the second PMOS and NMOS transistors 46 & 50. The capacitor 54 provides AC-coupling between the inverter amplifier portion 4 and the signal input 42 by filtering out unwanted DC components. The diode-connected first PMOS and NMOS transistors 44 & 48 provide a DC bias voltage to the gate terminals of the second transistors 46 & 50 via the resistor 52 that is equal to the voltage $V_G$ at the second node 36. Ideally, the voltage $V_G$ at the second node 36 would be directly coupled to the resistor 52, thereby causing the DC bias voltage provided to the inverter amplifier formed by the second transistors 46 & 50 to be exactly equal to $V_G$, thus causing the gate-source voltages of the transistors 24 & 46 to be equal. However, such an arrangement would result in the sinusoidal input signal $V_{in}$ propagating into the bias circuit portion 2, disturbing operation. Instead, the diode-connected first transistors 44 & 48, which are arranged as an inverter in a negative feedback configuration, replicate the third PMOS transistor 24 and the third NMOS transistor 30 of the bias circuit portion so as to generate a voltage between their drain terminals that is equal to the voltage $V_G$ at the second node 36. This means that the DC bias voltage provided to the gate terminals of the second transistors 46 & 50 via the resistor 52 is equal to the voltage $V_G$ at the second node 36, but any sinusoidal input signal $V_{in}$ propagating back through the resistor 52 does not disturb the operation of the bias circuit 2. Thus, the gate-source voltages ($V_{gs}$) of the third PMOS transistor 24 of the bias circuit 2 and the second PMOS transistor 46 of the inverter amplifier 4 are equal.

The voltage at the gate terminals of the second transistors 46 & 50 therefore oscillates around the DC bias voltage provided by the first transistors 44 & 48 as a result of the superposition of the DC bias voltage and the AC-coupled sinusoidal input signal 42. The oscillating voltage at the gate terminals of the PMOS transistor 46 and the NMOS transistor 50 cause these transistors to alternately switch on and off, thereby driving the voltage $V_{amp}$ at the fourth node 56 alternately between the voltage $V_{reg}$ at the first node 34 and the voltage $V_{SS}$ at the ground rail 14. When the voltage at the gate terminals of the second transistors 46 and 50 is above the DC bias voltage, the NMOS transistor 50 is switched on and the voltage $V_{amp}$ at the fourth node 56 is driven to ground ($V_{SS}$). When the voltage at the gate terminals of the second transistors 46 and 50 is below the DC bias voltage, the PMOS transistor 46 is switched on and the voltage $V_{amp}$ at the fourth node 56 is driven to $V_{reg}$ at the first node 34. When the voltage at the gate terminals of the second transistors 46 and 50 is near to the mid-point (i.e. the DC bias voltage), the transistors 46 & 50 function as a high-gain inverter amplifier. As a result, the voltage $V_{amp}$ at the fourth node 56 is a square wave oscillating between ground ($V_{SS}$) and $V_{reg}$ at the first node 34 with the same frequency as the sinusoidal input signal $V_{in}$ 42 but with a phase difference of 180° (i.e. inverted).

The inverter amplifier portion 4 is run in open-loop (i.e. there is no feedback provided between the fourth node 56 and the gate terminals of the second transistors 46 & 50). This ensures that the inverter amplifier portion 4 converts the sinusoidal input signal $V_{in}$ 42 into a square wave voltage signal $V_{amp}$ at the node 56 with maximum gain.

Operation of the level shifter portion 6 will now be described in more detail. The amplitude of the square wave signal $V_{amp}$ at the fourth node 56, as described above, set by the internal voltage $V_{reg}$ at the first node 34 and therefore needs to be level-shifted to match a known system voltage domain in order to be useful. The level-shifter portion 6 performs this function by shifting the square wave signal $V_{amp}$ at the fourth node 56 to a known system voltage level $V_{DDD}$ provided by the second positive voltage supply rail 60. The voltage $V_{DDD}$ at the second supply rail 60 may be any suitable known system voltage, including by not limited to 1.8V, 3.3V, 5V, etc.

The square wave signal $V_{amp}$ at the fourth node 56 is fed to the gate terminal of the third NMOS transistor 76 of the level shifter 6. It is also fed to the gate terminals of the first PMOS and NMOS transistors 66 & 68. These transistors 66 & 68 act as an inverter in the same way as the second transistors 46 & 50 of the inverter amplifier portion 4, and therefore invert the square wave signal $V_{amp}$ at the fourth node 56. The inverted signal is then fed to the gate terminal of the second NMOS transistor 74. When the square wave signal $V_{amp}$ at the fourth node 56 is at $V_{reg}$ (i.e. HIGH), the third NMOS transistor 76 is switched on, and the second NMOS transistor 74 (which is fed an inverted version of the signal $V_{amp}$) is switched off. Conversely, when the signal $V_{amp}$ is at ground ($V_{SS}$) (i.e. LOW), the third NMOS transistor 76 is switched off, and the second NMOS transistor 74 is switched on. When this happens, the $CK_{out}$ signal 64 output by the level shifter portion 6 is driven to ground ($V_{SS}$). This causes the cross-coupled second PMOS transistor 72 to switch on, causing the voltage at the drain terminal of the second PMOS transistor 72 to be driven to the voltage $V_{DDD}$ at the second positive voltage supply rail 58, thereby causing the other cross-coupled first PMOS transistor 70 to switch off.

When the third NMOS transistor 76 is switched on (i.e. when the signal $V_{amp}$ is HIGH, and therefore the second NMOS transistor 74 is switched off), the voltage at the drain terminal of the second PMOS transistor 72 is driven to ground ($V_{SS}$). This causes the cross-coupled first PMOS transistor 70 to switch on, thereby driving the $CK_{out}$ signal 64 to $V_{DDD}$. Hence the signal $CK_{out}$ 64 output by the level shifter portion 6 is a square wave signal with the same characteristics (e.g. frequency, phase, etc.) as the square wave signal $V_{amp}$ at the fourth node 56 but level shifted from the internal voltage $V_{reg}$ to the more useful known system voltage $V_{DDD}$ 60.

It will be appreciated by those skilled in the art that the invention has been illustrated by describing one or more specific embodiments thereof, but is not limited to these embodiments; many variations and modifications are possible within the scope of the appended claims.

The invention claimed is:

1. A circuit portion comprising:
   A load circuit portion comprising a first load transistor; and
   a bias circuit portion comprising:
      a first replica transistor matched to the first load transistor and connected to the first load transistor at a node such that when a current flows through the first replica transistor, a current proportional to the current through the first replica transistor flows through the first load transistor;
      a current input for receiving an input current;
      a supply voltage input for receiving a supply voltage; and
      a feedback loop arranged to:
         adjust a voltage at the node connecting the first replica transistor and the first load transistor such that the first replica transistor conducts a current proportional to the input current; and
         counteract variations in the voltage at the node connecting the first replica transistor and the first load transistor arising from changes in the supply voltage;
   wherein the first load transistor forms part of a load inverter, the first replica transistor forms part of a replica inverter, and the replica inverter is arranged to replicate the load inverter.

2. The circuit portion as claimed in claim 1, arranged such that a bias current is provided by the bias circuit portion to the load circuit portion that is substantially proportional to the input current.

3. The circuit portion as claimed in claim 1, arranged such that process, voltage and temperature variations in the first load transistor are replicated in the matched first replica transistor.

4. The circuit portion as claimed in claim 1, wherein the load circuit portion comprises a second load transistor, and the bias circuit portion comprises a second replica transistor matched to the second load transistor.

5. The circuit portion as claimed in claim 4, wherein the first and second replica transistors are arranged to replicate an arrangement of the first and second load transistors.

6. The circuit portion as claimed in claim 4, wherein the first and second replica transistors are arranged to replicate a current branch of the load circuit portion, the current branch comprising the first and second load transistors.

7. The circuit portion as claimed in claim 1, wherein the feedback loop comprises a plurality of feedback transistors, at least one feedback transistor being matched to at least one other feedback transistor.

8. The circuit portion as claimed in claim 7, wherein one of the feedback transistors is arranged to supply a total current required by the first replica transistor and the load circuit portion.

9. The circuit portion as claimed in claim 1, wherein the replica inverter comprises a plurality of replica transistors, the load inverter comprises a plurality of load transistors, and each replica transistor is matched to at least one load transistor.

10. The circuit portion as claimed in claim 1, further comprising a level shifter arranged to shift a voltage level of an output of the load inverter to a predetermined voltage.

11. The circuit portion as claimed in claim 1, arranged such that the load inverter is run in open loop.

12. A sinusoid-to-square wave buffer circuit portion comprising:
   the circuit portion as claimed in claim 1;
   a signal input for receiving a sinusoidal input signal coupled to an input of the load inverter, wherein the load inverter comprises a signal output arranged to output a square wave signal.

13. An electronic device comprising:
   the sinusoid-to-square wave buffer circuit portion as claimed in claim 12;
   an oscillator coupled to the signal input to provide said sinusoidal input signal; and
   a current source arranged to provide said input current.

14. A method of converting a sinusoidal input signal into a square wave output signal comprising providing said sinusoidal input signal to a circuit portion as claimed in claim 1 and using said circuit portion to generate said square wave output signal from said sinusoidal input signal.

* * * * *